United States Patent [19]
Edlinger

[11] Patent Number: 5,779,203
[45] Date of Patent: Jul. 14, 1998

[54] ADJUSTABLE WAFER CASSETTE STAND

[76] Inventor: Erich Edlinger, 11025 S. 51st St., Apt. 2059, Phoenix, Ariz. 85044

[21] Appl. No.: 671,155

[22] Filed: Jun. 28, 1996

[51] Int. Cl.$^6$ .................................................. F16M 11/04
[52] U.S. Cl. ...................... 248/178.1; 269/309; 269/903
[58] Field of Search ......................... 248/178.1, 185.1, 248/187.1, 291.1, 292.13; 269/55–58, 60, 71, 74, 76, 309–310, 315, 316, 317, 329, 900, 903

[56] References Cited

U.S. PATENT DOCUMENTS

| | | | |
|---|---|---|---|
| 4,750,857 | 6/1988 | Kochersperger | 414/609 |
| 4,762,353 | 8/1988 | Molinanaro | 294/1.1 |
| 4,805,348 | 2/1989 | Arai et al. | 51/118 |
| 4,934,680 | 6/1990 | Schneider | 269/309 |
| 5,022,619 | 6/1991 | Mamada | 248/187.1 |
| 5,065,991 | 11/1991 | Schneider | 269/309 |
| 5,099,614 | 3/1992 | Arai et al. | 51/165 |
| 5,163,651 | 11/1992 | Matsumoto | 248/913 X |
| 5,246,218 | 9/1993 | Yap et al. | |
| 5,329,732 | 7/1994 | Kalsrud et al. | 51/131.5 |
| 5,498,196 | 3/1996 | Kalsrud et al. | 451/11 |
| 5,498,199 | 3/1996 | Kalsrud et al. | 451/289 |

FOREIGN PATENT DOCUMENTS 0 445 654   9/1991   European Pat. Off.

OTHER PUBLICATIONS

Brown et al., "Substrate Handling Apparatus", Western Electric Technical Digest, No. 45, Jan. 1977, entire document.

"Universal Wafer–Boat–Alignment Fixture", IBM Technical Disclosure Bulletin, vol. 28, No. 11, Apr. 1986, entire document.

Primary Examiner—Beth A. Aubrey
Attorney, Agent, or Firm—Snell & Wilmer, L.L.P.

[57] ABSTRACT

The present invention relates, generally to a wafer cassette holding mechanism for use in processing wafers. The cassette holding mechanism has adjustable alignment posts to facilitate the cassette placement, and an adjustment guide for guiding the placement of the cassette on the holding mechanism so that the holding mechanism may be configured to receive and securely hold a variety of different sizes and brands of wafer cassettes. In addition, the cassette holding mechanism further includes a plurality of adjustment screws for fine tuning the level position of the support platform.

29 Claims, 8 Drawing Sheets

5,779,203

ADJUSTABLE WAFER CASSETTE STAND

TECHNICAL FIELD

The present invention relates, generally, to wafer cassette holding mechanisms, and more particularly to an adjustable platform for securely yet releasably holding a cassette containing a plurality of wafers.

BACKGROUND ART AND TECHNICAL PROBLEMS

Cassettes for holding stacks of wafers are generally well known in the semiconductor manufacturing industry. More particularly, a wafer cassette comprises a lightweight, hand-carryable housing configured with a plurality of parallel, spaced apart horizontal slots for storing a plurality of disks or wafers. In this context, the disks or wafers may comprise flat, circular silicon wafers used in the manufacture of integrated circuit components and the like. As the workpieces (wafers or disks) are processed, they often need to be transported from one operation to another within the same machine, or from one machine to another machine for further processing. A plastic or metal wafer cassette conveniently accommodates these needs.

A typical cassette comprises a housing having a substantially open front-facing portion to allow the convenient loading and unloading of individual workpiece, either manually or more typically through the use of precision robotics. The bottom of the cassette housing often comprises a flat portion to allow the cassette to remain stable when placed on a flat surface. The top of the cassette typically includes a handle for convenient manual grasping to transport the cassette from one processing position to the next. In addition, the rear portion of the cassette often includes one or more thin, elongated vertical post for securing engagement by a cassette holder, as described in greater detail below.

Cassettes for holding and transporting workpieces are often used in conjunction with Chemical Mechanical Planarization (CMP) machines. In particular, a fully loaded cassette, containing for example 25 wafers, may be placed in the unload compartment of a CMP machine, wafer cleaning machine, or the like. A robotic arm is configured to selectively retrieve wafers from the cassette, and transport the wafers one at a time to a processing station. When the machine (CMP, wafer cleaner, or the like) has finished processing each wafer, an unloading robotic arm retrieves each wafer from the final processing position and sequentially stacks each wafer into a particular slot within an unload cassette. For economy and interchangeability, the same or similar cassette housings may be employed as load cassettes and as unload cassettes in a broad variety of machines, as is well known in the industry. Once an unload cassette is filled with processed wafers, the machine operator may grasp the fully loaded cassette by the handle and transport the cassette to a subsequent processing station or facility.

In many processing environments, cassettes loaded with workpieces may be subject to vibration, which can cause wafers within a cassette to become dislodged. In view of the high cost of wafers, particularly silicon wafers in the latter stages of semiconductor fabrication, the cost of breakage should a wafer become dislodged from the cassette can be quite high. Accordingly, many wafer processing machines include tilting mechanisms configured to tilt the cassette rearwardly so that the wafers become gravity loaded against to the rear portion of the cassette housing, so even in the presence of vibrations the wafers cannot be dislodged from the cassette.

Presently known cassette holder platforms such as cassette holders used in CMP machines, wafer cleaning machines, and the like, are unsatisfactory in several regards. For example, often the stepper motors and other actuators used to tilt the wafer cassettes may dislodge the cassette housing from the cassette holder as the cassettes are tilted. This can cause misalignment of the individual wafers with respect to the robotic arms configured to load and unload wafers from the cassettes.

In addition, a broad range of cassette housing designs are available from a number of different manufacturers. While many CMP and other wafer processing machines include cassette platforms designed to accommodate many of these cassette housing designs, a universal cassette holder capable of accommodating a broad variety of cassette housing designs is still needed.

Presently known cassette platforms are further unsatisfactory in that they do not easily accommodate the leveling adjustments necessary to properly position the cassettes. In particular, presently known leveling mechanisms are cumbersome and typically require a separate tightening screw for each adjustment screw.

A cassette holder which addresses the shortcomings of the prior art is thus needed.

SUMMARY OF THE INVENTION

The present invention provides a new and improved cassette holder which addresses and resolves many of the shortcomings of the prior art.

In accordance with a preferred embodiment of the present invention, a cassette support platform includes a substantially flat, horizontal cassette support platform upon which virtually any cassette design may be stably placed. In accordance with a further aspect of the present invention, the cassette support surface has associated with it an adjustable cassette guide at the forward portion of the support platform, and two alignment posts disposed at the rearward portion of the support platform for securely receiving the vertical wings which typically project rearwardly from the back of the cassette housing. Both the alignment posts as well as the cassette guide are freely adjustable to accommodate virtually any cassette design.

In accordance with a further aspect of the present invention, the support platform may be adjusted to a level position (or to any desired position) using a plurality (e.g., 3) of adjustment screws to fine tune the level position of the support platform. In a particularly preferred embodiment of the present invention, a wing screw is employed at the center of gravity of the triangle defined by the three adjustment screws, such that the leveling position of the three adjustment screws may be rigidly fixed by a single wing screw.

BRIEF DESCRIPTION OF THE DRAWING FIGURES

The subject invention will hereinafter be described in conjunction with the appended drawing figures, wherein like numerals denote like elements, and:

DETAILED DESCRIPTION OF PREFERRED EXEMPLARY EMBODIMENT

Figure 1A:
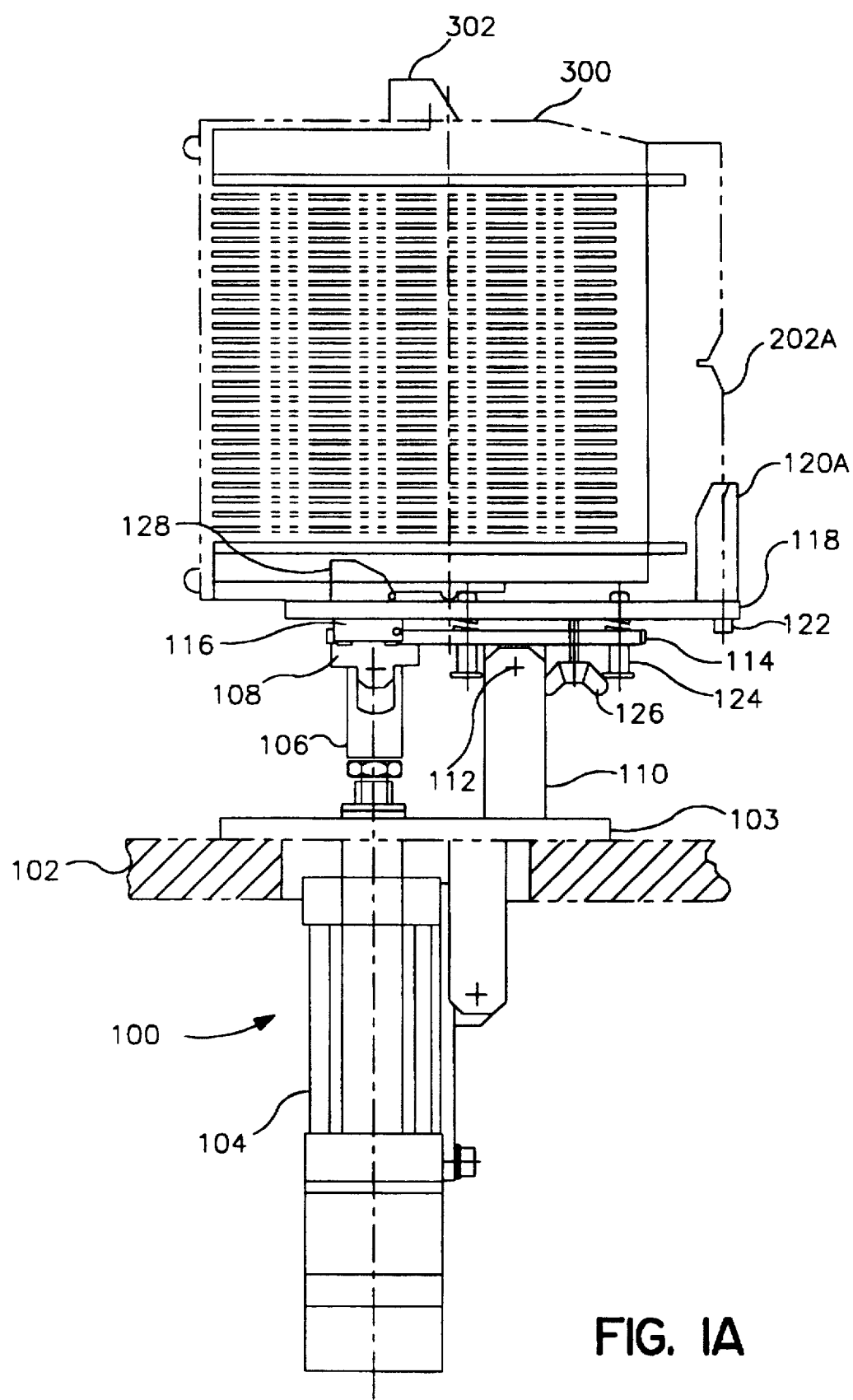
FIG. 1A is a side elevation view of a wafer cassette stand including a tilt actuator, shown with an empty wafer cassette positioned on the support platform of the cassette stand.
Figure 1B:
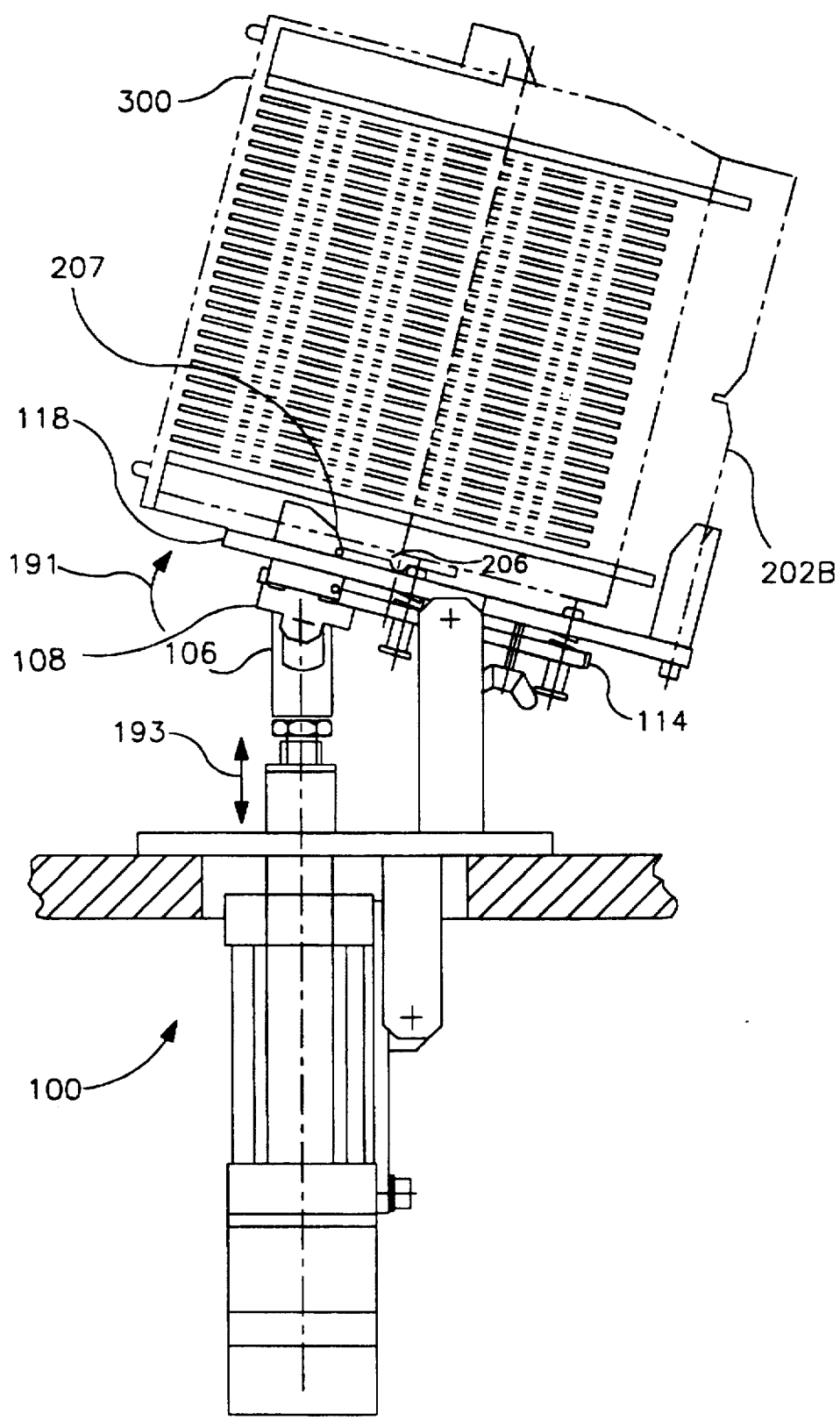
FIG. 1B shows the assembly of FIG. 1A in a tilted position.

Referring now to FIGS. 1A and 1B, an exemplary wafer cassette housing 300 is shown secured within an exemplary wafer cassette stand 100. In accordance with a preferred embodiment of the present invention, wafer cassette stand 100 may be configured to accommodate a variety of different designs and configurations of cassette housings 300. In this regard, suitable cassettes 300 are available from a number of cassette housing manufacturers, including the XT200 manufactured by Empak, the A192-81M-0215 and A198-80M-47C02 available from Fluroware, and the like. The specifications and general design parameters for wafer cassette housings are generally defined by SEMATECH specification SEMI E1-86. In this regard, the present invention may be configured to accommodate virtually any type of workpiece cassette, including both plastic and metal wafer carriers used for 3 inch, 100 millimeter, 125 millimeter, 150 millimeter, 200 millimeter, and 300 millimeter diameter wafers, including wafer carriers useful both in a general usage and auto transport usage classifications.

Figure 3:
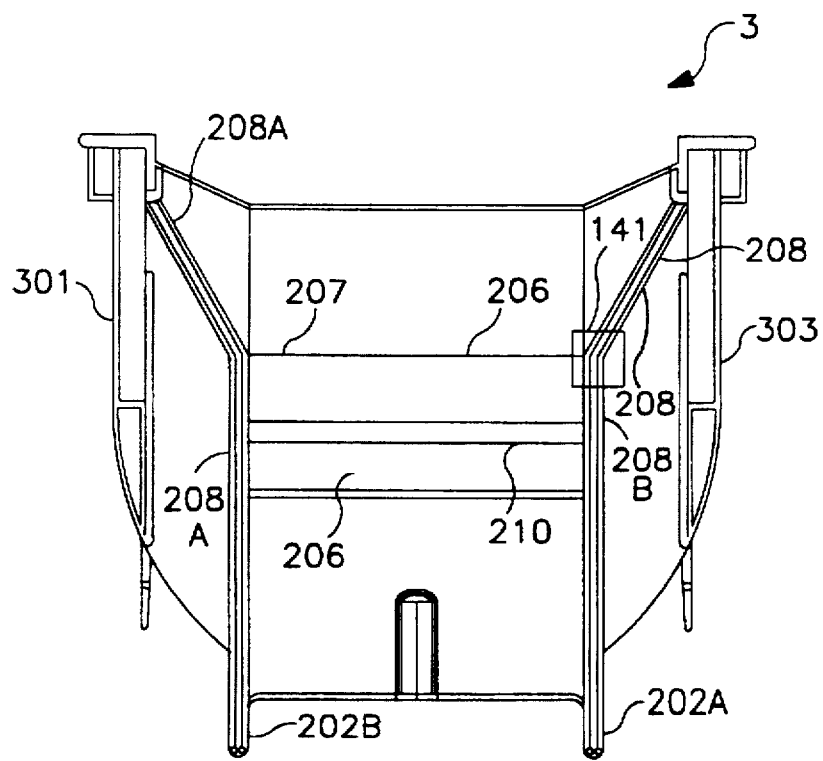
FIG. 3 is a bottom view of the cassette housing of FIG. 2.
Figure 5:
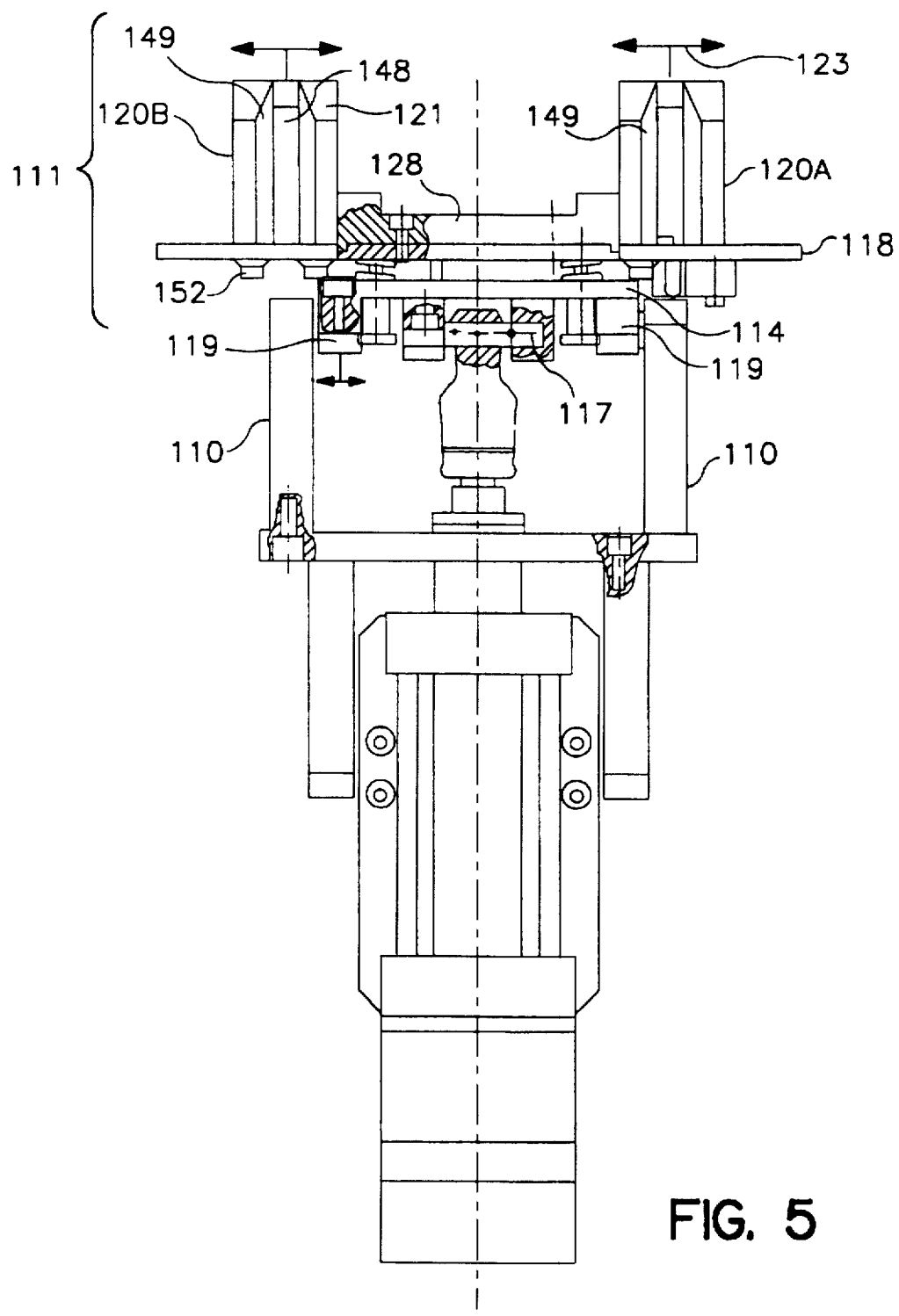
FIG. 5 is a front view of the assembly of FIG. 4.
Figure 8:
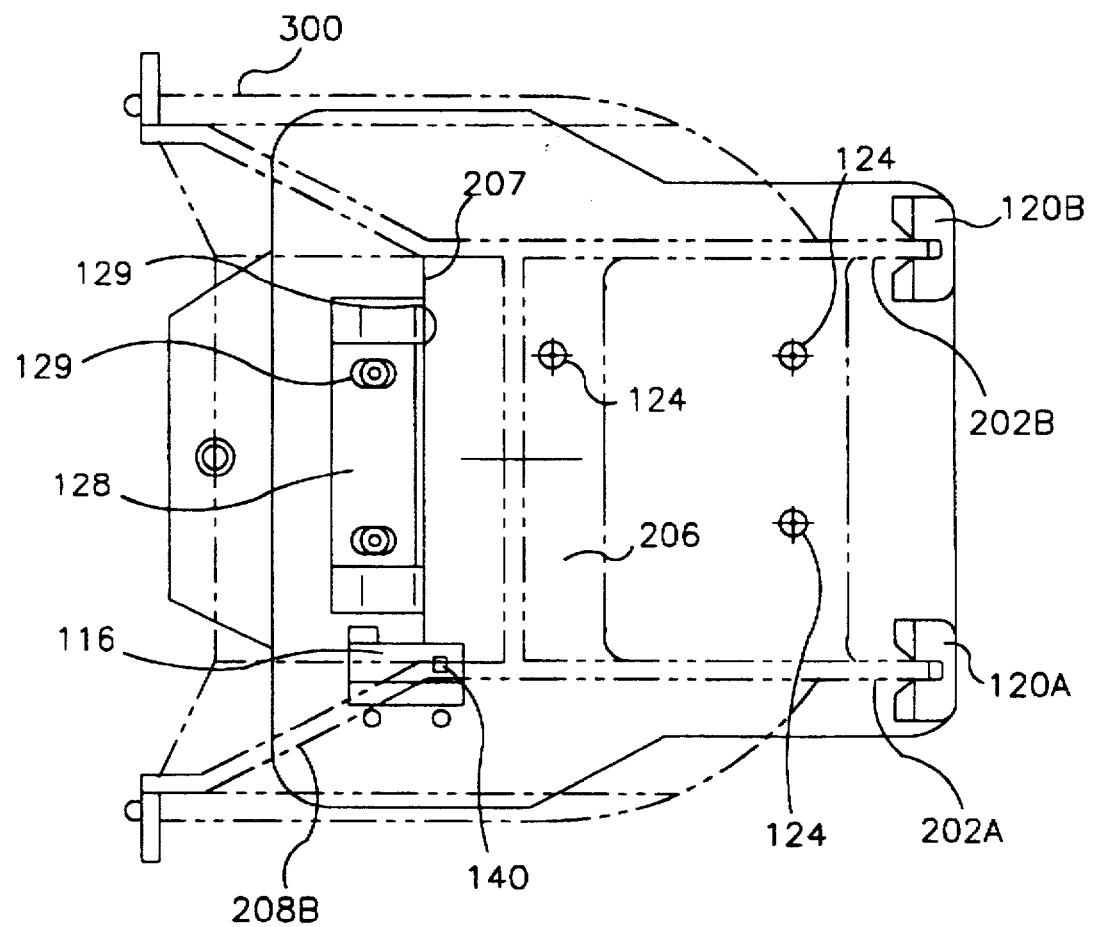
FIG. 8 is a top plan view of the cassette platform of FIG. 7, shown with an exemplary cassette housing emphantom atop the platform.

With continued reference to FIG. 1, cassette housing 300 suitably includes a handle 302 and respective wings 202A and 202B, described in greater detail in conjunction with FIGS. 3, 5, and 8. When it is desired to load a cassette 300 into cassette stand 100, the machine operator may grasp handle 302 and place the cassette housing onto the cassette platform associated with cassette stand 100. If the operator determines that the cassette platform does not conveniently accept cassette 300, the operator may adjust cassette stand 100 to thereby "tune" the cassette stand to the particular cassette configuration currently used by the operator in conjunction with cassette stand 100, as described in greater detail below.

With continued reference to FIGS. 1A and 1B, cassette stand 100 suitably comprises an actuator assembly 104, for example a linear stepper motor, servo motor, cam drive assembly, or the like configured to controllably tilt cassette 300 along arrow 191, as shown in FIG. 1B. In this regard, cassette stand 100 suitably includes a datum platform 103 which is rigidly secured to a fixed panel 102 associated with the processing machine within which cassette stand 100 is embodied. See, for example, Arai, et al., U.S. Pat. No. 5,099,614, issued March, 1992; Karlsrud, U.S. Pat. No. 5,498,196, issued March, 1996; Arai, et al., U.S. Pat. No. 4,805,348, issued February, 1989; Karlsrud et al., U.S. Pat. No. 5,329,732, issued July, 1994; and Karlsrud et al., U.S. Pat. No. 5,498,199, issued March, 1996, for a discussion of CMP and other machines within which cassette stand 100 may be conveniently employed.

Although the present invention is illustrated in the context of a tiltable cassette stand, the inventions described herein are not so limited. In particular, the various adjustment features may be employed in virtually any cassette stand, including non-tiltable, rotatable and rigid cassette stands and holders.

Figure 2:
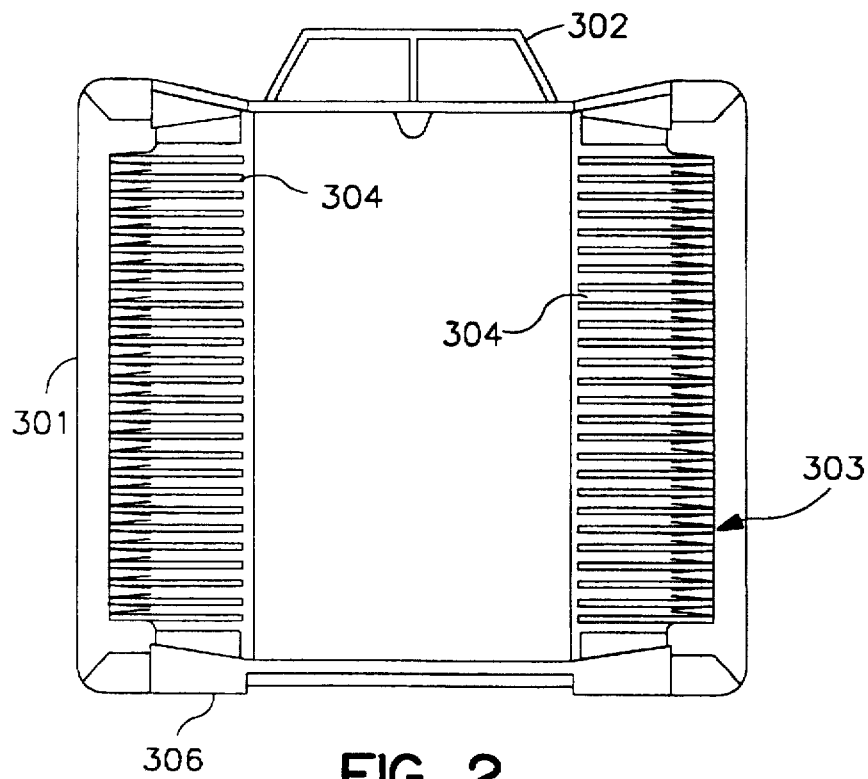
FIG. 2 is a front elevation view of the wafer cassette housing shown in FIG. 1.

With momentary reference to FIGS. 2 and 3, cassette 300 suitably comprises an open front portion which permits the convenient loading and unloading of wafers into the cassette, a bottom portion 306, a left side panel 301 and a right side panel 303. In the illustrated embodiment, left side panel 301 and right side panel 303 each comprise a plurality of slots 304 within which individual wafers are stored.

With particular reference to FIG. 3, bottom 306 of housing 300 suitably comprises a flange 206 which extends at least partially between left panel 301 and right panel 303. Flange 206 preferably includes a forward facing flange edge 207 and a ridge 210. Bottom surface 306 further includes respective ridges 208A and 208B which suitably comprise thin, elongated web features extending downwardly from the bottom of the cassette. As described in greater detail below, ridges 208 are convenient features of housing 300 for engaging the cassette present sense switch associated with cassette stand 100, as described in further detail below.

With continued reference to FIG. 3, cassette housing 100 further includes respective rearwardly extending wings 202A and 202B, which suitably comprise thin, flat, wings which extend rearwardly in parallel vertical planes from the backside of housing 300.

Figure 4:
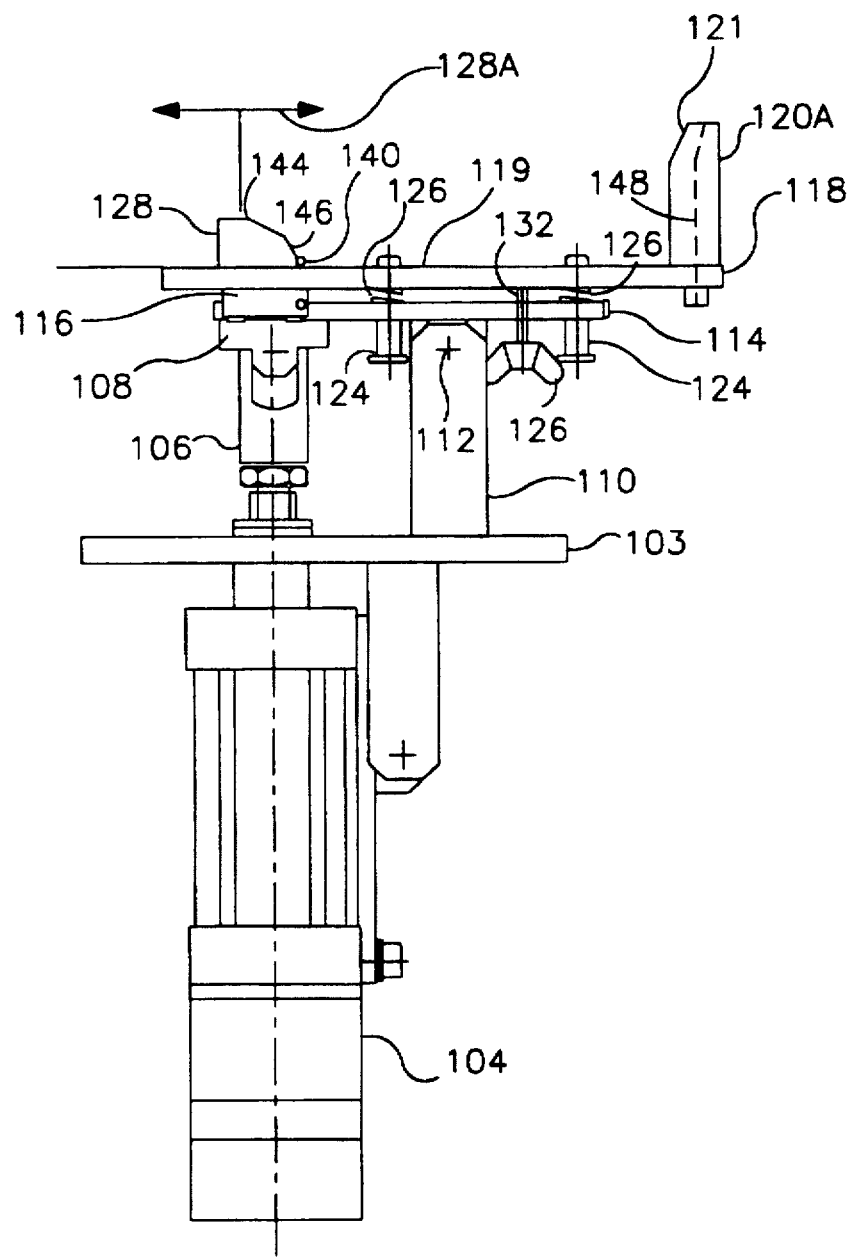
FIG. 4 is a closeup view of an exemplary embodiment of the support platform, alignment posts, adjustment bracket, and tilting mechanism of the cassette stand of FIG. 1.

Referring now to FIGS. 1A, 4 and 5, cassette stand 100 further comprises respective pivot mounts 110 about which pivoting assembly 111 is configured to pivot.

More particularly, pivoting assembly 111 suitably comprises a cassette support platform 118, having a cassette adjustment guide 128 and respective cassette alignment posts 120A and 120B adjustably secured to support platform 118. A cassette presence switch button 140 suitably extends upwardly from the surface of platform 118, and is advantageously configured to deflect downwardly when a cassette 300 is placed on platform 118. In particular, as a cassette 300 is placed onto platform 118, switch 140 is pressed downwardly, indicating that a cassette is present on platform 118. When cassette 300 is removed from platform 118 or otherwise becomes dislodged from the platform, switch 140 is urged upwardly, for example, by an internal biasing spring, indicating that no cassette is present on platform 118. In this regard, a suitable switch housing 116, which may comprise the electronics associated with switch 140 may be secured (e.g., flush mounted) to the underside of platform 118. A suitable wire (not shown) or other communication facility may be employed in connection with switch 140 and switch housing 116 to transmit a cassette present/cassette not present signal to an appropriate operator screen.

Referring now to FIGS. 1 and 4–8, pivoting assembly 111 further comprises a leveling plate 114 which is substantially parallel to cassette support platform 118. Support platform 118 is suitably secured to leveling plate 114 through a plurality (e.g., 3) of leveling assemblies 124. Assemblies 124 may comprise a fixed nut into which a screw is threaded, on a fixed screw over which a nut is threaded, or another convenient mechanism for positioning platform 118 with respect to plate 114. In the illustrated embodiment, respective biasing springs 126, associated with respective leveling screws 124, are suitably interposed between support platform 118 and leveling plate 114 to bias platform 118 away from leveling plate 114. As described in greater detail below, wing adjustment 126 is suitably configured to fix the particular leveling position of platform 118 established by operator manipulation of respective leveling screws 124.

and to maintain the adjustment in place even as cassette stand 100 is subject to vibrations and the like.

With particular reference to FIGS. 1 and 4, FIGS. 1A and 4 show the subject cassette stand in the nominal, horizontal position. When it is desired to tilt pivoting assembly 111 and, hence, cassette 300 into the tilted position shown in FIG. 1B, actuator assembly 104 extends upwardly (along arrow 193 in FIG. 1B) such that a clevis 106 associated with actuation assembly 104 exerts an upward force on a shaft 109 extending between respective clevis brackets 108. Shaft 109 transmits the actuating force to plate 114, causing pivoting assembly 111 to pivot about a shaft 117 having a horizontal axis 112 associated therewith. More particularly, respective bearing brackets 119 are rigidly secured to the undersurface of leveling plate 114, such that pivoting shaft 117 is journaled through respective bearing brackets 119 and rotatably mounted within support arms 110. In this way, as actuator assembly 104 urges clevis assembly 108, 109 upwardly, leveling plate 114 rotates about shaft 117 supported by pivot arms 110. As leveling plate 114 pivots about axis 112, support platform 118 similarly pivots about axis 112, inasmuch as platform 118 is essentially rigidly secured to leveling plate 114 through the interaction of respective leveling screws 124 and wing screw 126.

Figure 7:
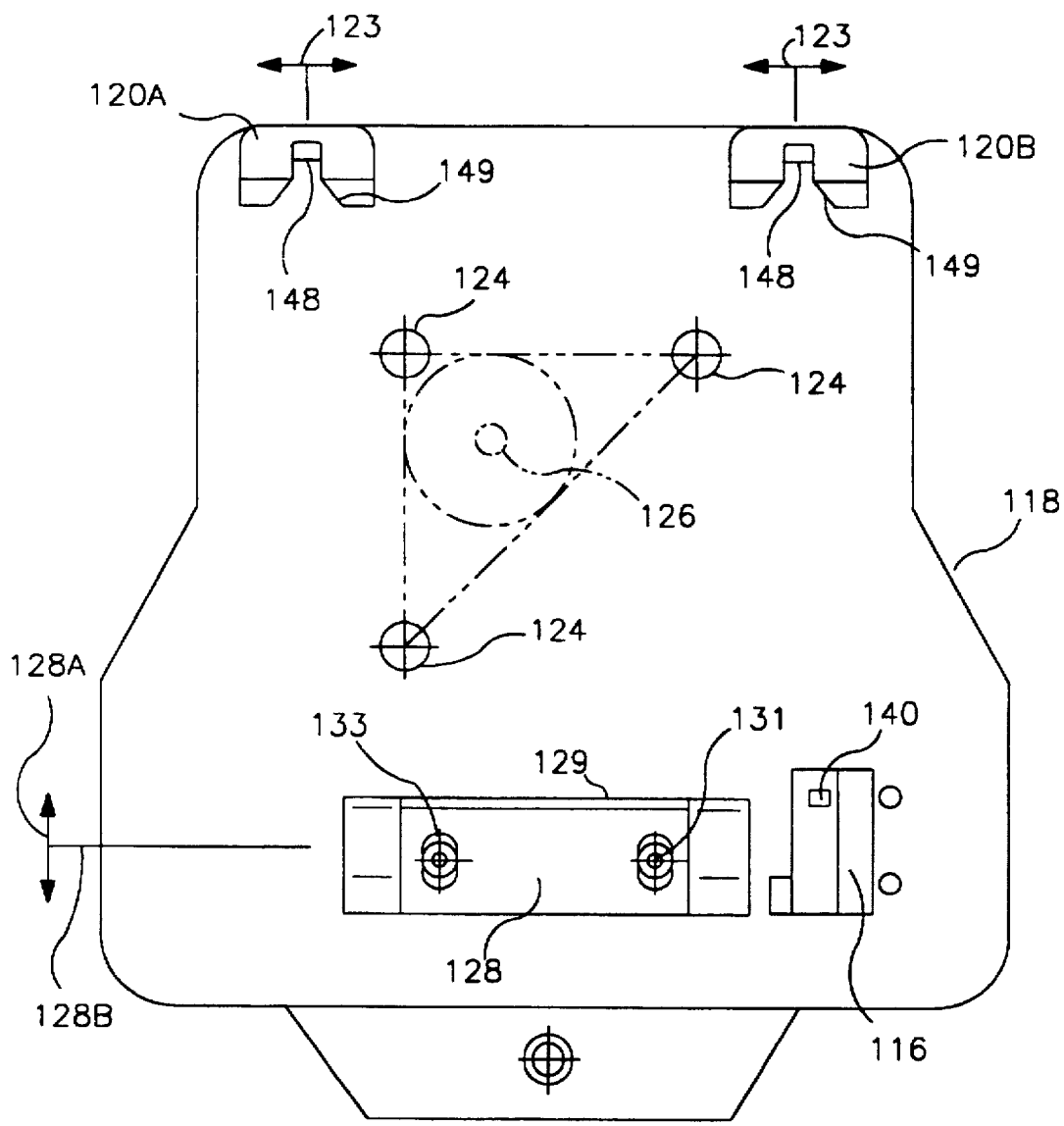
FIG. 7 is a top plan view of an exemplary cassette platform, illustrating the configuration of the level adjustment screws and wing screw.

With momentary reference to FIG. 7, wing screw 126 is suitably positioned at the center of gravity defined by respective adjustment screws 124. Specifically, the center of gravity of the triangle defined by respective adjustment screws 124 may be determined by drawing an internal circle tangent to each of the three lags comprising the triangle; the center of gravity of the triangle corresponds to the center of the circle. Alternatively, the center of gravity of the triangle may be defined by the intersection of the three imaginary lines which respectively bisect the three internal angles of the triangle. With momentary reference to FIG. 4, threaded shaft 132 of wing screw 126 suitably threadly engages plate 114, and bottoms out on the underside of platform 118. As a result, wing screw 126 may be tightened, forcibly urging plate 114 away from platform 118. In this way, the level position of platform 118, as determined by respective leveling screws 124 with respect to plate 114, may be maintained.

The manner in which cassette stand 100 may be adjusted to accommodate a plurality of different cassette housing designs will now be described in accordance with the present invention.

Referring now to FIGS. 1, 3, 5, and 7, the two principal cassette stand adjustment mechanisms in accordance with the illustrated embodiment surround a cassette adjustment guide 128 and respective alignment posts 120A and 120B. In particular, adjustment guide 128 is suitably positioned so that its rearward facing edge 129 (see FIG. 7) abuts leading edge 207 of flange 206 (see FIG. 3) when housing 300 is placed on support platform 118. At the same time, respective wings 202A and 202B (see FIG. 3) are received within respective alignment posts 120A and 120B (see FIGS. 5, 7 and 8).

In order to conveniently accommodate cassette housings having dimensional variations or different design configurations, the adjustability of adjustment guide 128 and alignment posts 120 exploits the fact that virtually all cassette housings have at least the following two features in common: (1) a bottom flange similar to flange 206 having a leading edge 207 which abuts against leading edge 129 of guide 128; and (2) respective vertical wings analogues to wings 202 of cassette 300 which are spaced apart in the range of 3 to 6 inches (and most preferably about 4.7 inches) for convenient receipt within alignment post 120. For cassette housings which have wings 202 which are separated by a greater or lesser distance, respective alignment posts 120 may be adjusted along respective arrows 123 (see FIGS. 5 and 7) to ensure that alignment posts 120 optimally accommodate the wing configuration of the particular cassette housings being used. Moreover, the position of cassette guide 128 may be adjusted, for example, along arrow 128A (see FIG. 7), to obtain an optimal "fit" between the housing and the support platform. With momentary reference to FIG. 1A, the particular position of respective posts 120 along arrows 123 may be secured by any suitable mechanism, for example through the use of an adjustment screw 122. Similarly and with particular reference to FIG. 7, the particular position of guide 128 along arrow 128A, as well as the extent to which guide 128A is aligned with or deviates from nominal position 128B, may be secured by suitable adjustment screws 131 which are configured to slide within respective oval recesses 133 as guide 128 is manually positioned along arrow 128A.

Figure 6:
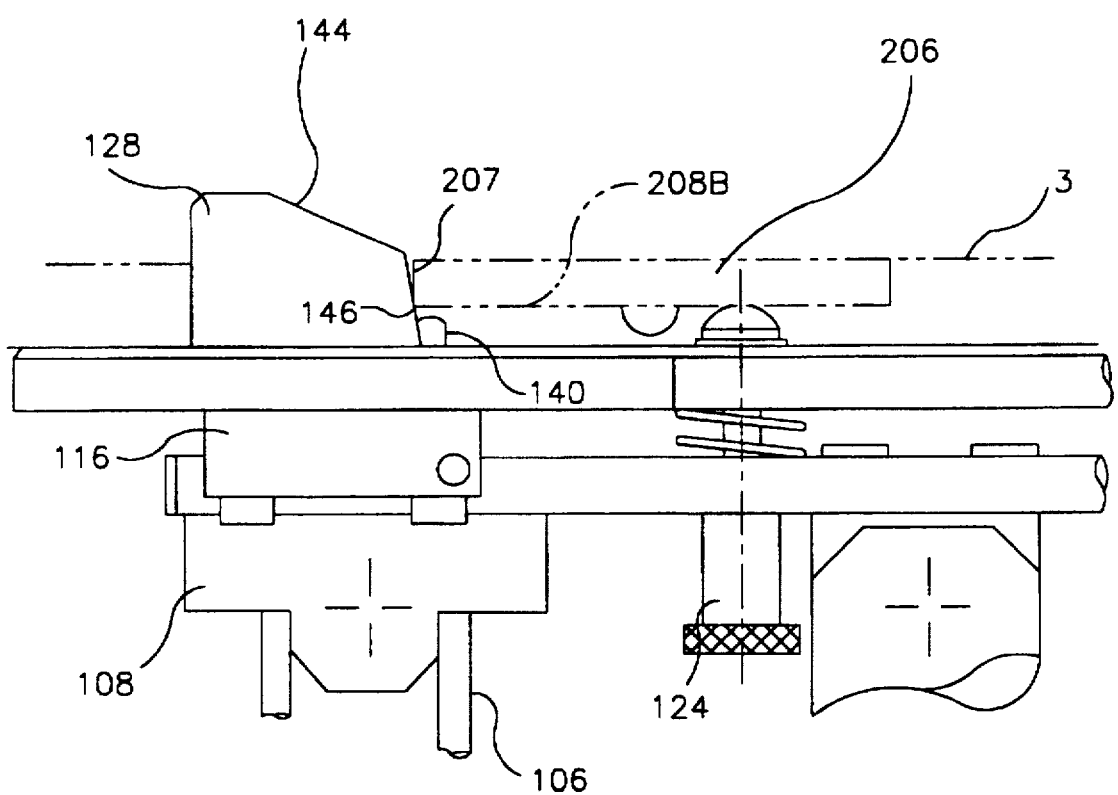
FIG. 6 is a detailed view of the cassette flange abutting the adjustment guide shown in FIG. 1.

Referring now to FIGS. 6-8, when cassette 300 is properly placed on platform 118, underside 306 of cassette housing 300 suitably engages switch 140, actuating switch mechanism 116 indicating that a cassette is present on platform 118. More particularly, by properly aligning cassette 300 on platform 118 as described above in conjunction with the adjustment features of the present invention, a portion of ridge 208B (or alternatively ridge 208A), which suitably extends downwardly below the surface defined by flange 206, configured to contact switch 140 and depress the switch. In accordance with a particularly preferred embodiment, a region 141 (see FIG. 3) of ridge 208 proximate the outer edge of flange 206 is positioned to contact switch 140.

In accordance with a further aspect of the present invention, various of the adjustable features described herein are optimally configured to facilitate the placement of cassette 300 onto platform 118. Referring now to FIGS. 4 and 5-7, cassette adjustment guide 128 suitably comprises a first angled surface 144 and a second angled surface 146 configured to guide leading edge 207 of flange 206 rearwardly (i.e., to the right in FIGS. 4 and 6) and downwardly as cassette 300 is being placed onto platform 118. This is particularly helpful when a cassette filled with wafers is being placed on the platform, inasmuch as the presence of the wafers blocks the operator's view of adjustment guide 128. In effect, angled surfaces 144 and 146 guide leading edge 207 of flange 206 into position as the operator lowers the cassette onto the platform.

Referring now to FIGS. 4–5 and 7–8, respective alignment posts 120A and 120B each include a central slot 148 within which respective wings 202A and 202B are received. More particularly, each slot 148 suitably comprises a dove tail or bevel guide 149 which assist in the alignment of each wing 202 into slot 148. That is, if wing 202 is not properly aligned with the center of slot 148, i.e., if wing 202 is displaced along arrow 123 from the nominal position, guide 149 will facilitate the alignment of wing 202 into the center of slot 148, again even if the operator's view of the wing and slot is obscured.

With continued reference to FIGS. 4 and 5, each respective alignment post 120 further comprises an angled surface 121 which facilitates the lowering of cassette 300 downwardly onto platform 148, and further facilitates the insertion of respective wings 202 into respective slot 148 as cassette 300 is placed onto to platform 118.

Although the present invention has been described herein in conjunction with the appended drawing figures, it will be appreciated that the scope of the invention is not so limited. For example, while the common features of the cassette have been described as the rearwardly projecting wings and the leading edge of the bottom flange, it will be appreciated that virtually any features of the cassettes may be employed which are generally common among various designs for use in "tuning" the cassette stand in accordance with the principals of the present invention. Moreover, although the invention has been described in conjunction with semiconductor (e.g., microprocessor) wafer cassettes, virtually any workpiece which involves the use of a workpiece housing can be accommodated in the context of the present invention. These and other modifications and the selection, design and arrangement of the various component and steps discussed herein may be made without departing from the spirit of the invention as set forth in the appended claims.

I claim:

1. A cassette stand for holding a cassette of the type configured to hold a plurality of wafers, said cassette being of the type including a bottom flange having a leading edge and respective first and second rearwardly projecting vertically extending wings, said cassette stand comprising:

a platform upon which said cassette may be placed;

an adjustment guide on said platform positioned to abut said leading edge of said flange of said cassette;

respective first and second alignment posts extending upwardly from said platform and configured to receive said first and said second wings of said cassette, respectively; and wherein said adjustment guide is movable about said platform and securable at a desired position on said platform, and further wherein said first and said second alignment posts are moveable about said platform and fixable at desired positions on said platform.

2. The cassette stand of claim 1, wherein said adjustment guide comprises a first angled surface and a second angled surface to guide said cassette into position on said cassette stand.

3. The cassette stand of claim 1, wherein said first and said second posts are secured to said platform using adjustable screws.

4. The cassette stand of claim 1, wherein said adjustment guide is secured to said platform using an adjustable screw.

5. The cassette stand of claim 1, further comprising a tilt mechanism configured to cause said platform to tilt, and a leveling plate rigidly securable to a machine which is configured to process said wafers.

6. The cassette stand of claim 5, wherein said tilt mechanism comprises:

an engagement block fixedly attached on an underside of said leveling plate;

a pivot shaft about which said platform and said leveling plate are configured to rotate; and an actuator assembly configured to apply a force onto said engagement block, causing said platform and said leveling plate to rotate about said pivot shaft, causing said platform to tilt.

7. The cassette stand of claim 6, wherein said engagement block further comprises:

respective first and second brackets attached to said leveling plate;

an engagement shaft extending between said first and said second brackets; and wherein said actuator assembly is configured to apply a force to said engagement shaft which, in turn, transmits said force to said leveling plate and said platform, causing said leveling plate and said platform to rotate about said pivot shaft.

8. The cassette stand of claim 1, further comprising a cassette present sensor.

9. The cassette stand of claim 8, wherein said cassette present sensor is mounted flush with said platform.

10. The cassette stand of claim 1, further comprising a leveling plate securely fastened to said platform.

11. The cassette stand of claim 10, further comprising a plurality of adjustment screws interconnecting said platform and said leveling plate and maintaining said platform substantially parallel to said leveling plate, wherein each one of said plurality of adjustment screws are independently adjustable to fix the planar orientation of said platform with respect to said leveling plate.

12. The cassette stand of claim 11, wherein 3 leveling screws are used, said 3 leveling screws defining a triangle on the plane of said leveling plate, and wherein a set screw is located substantially near a center of said triangle, said set screw configured to threadedly engage said leveling plate and bottom out on an underside of said platform such that, when said set screw is tightened, said leveling plate and said platform are urged away from each other, fixing the position of each of said adjustment screws.

13. A cassette stand for supporting a cassette of the type configured to hold a plurality of semiconductors wafers, said cassette stand comprising:

a support platform upon which said cassette is supportable;

a leveling plate rigidly securable to a machine which is configured to process said wafers;

a plurality of leveling screws interconnecting said support platform and said leveling plate and maintaining said support platform substantially parallel to said leveling plate, wherein each one of said plurality of leveling screws are independently adjustable to fix the planar orientation of said support platform with respect to said leveling plate; and a single set screw configured to threadedly engage said leveling plate and bottom out on an underside of said support platform such that, when said set screw is tightened, said leveling plate and said support platform are urged away from each other, fixing the position of each of said leveling screws.

14. The cassette stand of claim 13, wherein 3 of said leveling screws are used, said 3 leveling screws defining a triangle, and wherein said set screw is disposed at the center of gravity of said triangle.

15. The cassette stand of claim 13, further comprising an adjustment guide on said support platform configured to abut a leading edge of a flange of said cassette.

16. The cassette stand of claim 15, wherein said adjustment guide is moveable about said support platform, and securable at a desired position on said support platform.

17. The cassette stand of claim 15, wherein said adjustment guide comprises a first angled surface and a second angled surface to guide said cassette into position on said cassette stand.

18. The cassette stand of claim 16, wherein said adjustment guide is secured to said support platform using an adjustable screw.

19. The cassette stand of claim 13, further comprising respective first and second alignment posts extending upwardly from said support platform and configured to receive first and second wings of said cassette, respectively.

20. The cassette stand of claim 19, wherein said first and said second alignment posts are moveable about said support platform and fixable at desired positions on said support platform.

21. The cassette stand of claim 20, wherein said first and said second alignment posts are secured to said support platform using adjustable screws.

22. The cassette stand of claim 13, further comprising a tilt mechanism configured to cause said support platform to tilt.

23. The cassette stand of claim 22, wherein said tilt mechanism comprises:

an engagement block fixedly attached on an underside of said leveling plate;

a pivot shaft about which said support platform and said leveling plate are configured to rotate; and an actuator assembly configured to apply a force onto said engagement block, causing said support platform and said leveling plate to rotate about said pivot shaft, causing said support platform to tilt.

24. The cassette stand of claim 23, wherein said engagement block further comprises:

respective first and second brackets attached to said leveling plate;

an engagement shaft extending between said first and said second brackets; and wherein said actuator assembly is configured to apply a force to said engagement shaft which, in turn, transmits said force to said leveling plate and said support platform, causing said leveling plate and said support platform to rotate about said pivot shaft.

25. The cassette stand of claim 13, further comprising a cassette present sensor.

26. The cassette stand of claim 25, wherein said cassette present sensor is mounted flush with said support platform.

27. A method for establishing a substantially level wafer cassette platform, comprising the steps of:

providing a wafer cassette stand comprising a support platform, a leveling plate, and a plurality of leveling screws interconnecting said support platform and said leveling plate;

securing said leveling plate to a machine configured to process wafers; and adjusting at least one of said leveling screws so that at least a portion of said support platform is moved with respect to said leveling plate, causing said support platform to be substantially parallel to said leveling plate.

28. The method of claim 27, wherein at least three leveling screws are provided, and wherein a set screw is provided at a center of gravity of said at least three leveling screws, said set screw configured to threadedly engage said leveling plate and bottom out on said support platform; said method further comprising the step of:

fixing the position of each of said leveling screws and said leveling plate by moving said leveling plate and said support platform away from each other by tightening said set screw.

29. The method of claim 27, further comprising the step of tilting said support platform by applying a force to a bottom surface of said leveling plate and rotating said leveling plate and support platform about an axis of a shaft connected to said leveling plate.

* * * * *